United States Patent [19]
Sawada et al.

[11] Patent Number: 6,157,992
[45] Date of Patent: *Dec. 5, 2000

[54] SYNCHRONOUS SEMICONDUCTOR MEMORY HAVING READ DATA MASK CONTROLLED OUTPUT CIRCUIT

[75] Inventors: Seiji Sawada; Yasuhiro Konishi, both of Hyogo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/768,089

[22] Filed: Dec. 16, 1996

[30] Foreign Application Priority Data

Dec. 19, 1995 [JP] Japan ................... 7-330394

[51] Int. Cl.$^7$ ................................. G06F 12/00
[52] U.S. Cl. ................... 711/167; 711/105; 711/154; 365/194; 365/233
[58] Field of Search ...................... 711/105, 167, 711/100, 101, 154, 104; 395/800.23; 365/233, 189.02, 233.5, 189.04, 189.05, 194, 230.02, 230.08, 333

[56] References Cited

U.S. PATENT DOCUMENTS

| 5,103,466 | 4/1992 | Bazes ................... 375/361 |
|---|---|---|
| 5,463,590 | 10/1995 | Watanabe . |
| 5,521,878 | 5/1996 | Ohtani et al. ................ 365/233 |
| 5,631,871 | 5/1997 | Park et al. ................ 365/203 |
| 5,708,622 | 1/1998 | Ohtani et al. ................ 365/233 |
| 5,781,789 | 7/1998 | Naroyan ................ 395/800.23 |
| 5,966,319 | 10/1999 | Sato ................ 365/154 |
| 5,983,314 | 11/1999 | Merritt ................ 711/105 |
| 6,049,488 | 4/2000 | Sawada ................ 365/189.05 |

OTHER PUBLICATIONS

Yuji Sakai et al., "A Synchronous DRAM with New High-Speed I/O Lines Method for the MultiMedia Age", IEICE Trans. Electron., vol. E78–C, Jul. 7, 1995, pp. 782–788.

*Primary Examiner*—John W. Cabeca
*Assistant Examiner*—Pierre-Michel Bataille
*Attorney, Agent, or Firm*—McDermott, Will & Emery

[57] ABSTRACT

A read enable signal OEMF activated in response to an input command is applied to an N minus 2 clock shift circuit included in an output control circuit for implementation of ZCAS latency. An output signal of the N minus 2 clock shift circuit and an internal mask instructing signal activated in response to an external mask instructing signal are logically processed and applied to a one-clock shift circuit. According to an output signal OEMQM of one-clock shift circuit, a data output enable signal OEM controlling activation/inactivation of an output buffer circuit is activated/inactivated. Data output controlling portion occupying area of a synchronous dynamic random access memory is reduced and timings of activation/inactivation of data output by different commands are made the same.

13 Claims, 6 Drawing Sheets

FIG.1 SYNCHRONOUS DRAM

FIG. 2

FIG.3   DRAM TIMING SHOWING ZCAS LATENCY

FIG.4   CLOCK SHIFT CIRCUIT

SYNCHRONOUS SEMICONDUCTOR MEMORY HAVING READ DATA MASK CONTROLLED OUTPUT CIRCUIT

BACKGROUND OF THE INVENTION

1. Field of the Invention

The invention relates to a synchronous semiconductor memory device. It particularly relates to a configuration of a data output controlling portion which controls activation/inactivation of an output buffer circuit which in turn outputs data synchronously with a clock signal.

2. Description of the Background Art

A synchronous dynamic random access memory (referred to as "an SDRAM" hereinafter) incorporates external control signals and address signals as well as data synchronously with an externally applied clock signal such as an system clock and also outputs data synchronously with the clock signal. The internal operation manner of the SDRAM is typically determined by states of the external control signals at a rising edge of the clock signal. A combination of states of the external control signals at the rising edge of the clock signal is referred to as "a command". Since the SDRAM takes in the external control signals synchronously with the clock signal and identifies the content of the command, it is not necessary to take into consideration a timing margin for skew of the external control signals or the like, and starting timing of the internal operation can be advanced. Furthermore, since data is input/output synchronously with the clock signal, operating rate of the SDRAM can be determined by the clock signal and an SDRAM operating at high speed can be implemented.

However, typically in data read operation, internal operations are required, starting from applying a read command, internally selecting a memory cell and outputting a valid data. The number of cycles of a clock signal required from the application of the read command to the output of the valid data is referred to as ZCAS latency. The ZCAS latency can be set to an appropriate value of 1, 2, 3, 4 or the like according to an external signal.

Furthermore, in the synchronous dynamic random access memory, a plurality of memory cells are simultaneously selected by one access (i.e., one column selecting operation) and the simultaneously selected memory cells are sequentially accessed synchronously with a clock signal. When reading data, data which is not required by a CPU (central processing unit), which is an external processing unit, may be included in the selected memory cell data. In this case, output data is masked by setting a mask instructing signal DQM which in turn is externally applied at an active state of H level. Typically, data in a cycle in an elapse of the number of clock cycles referred to as DQM latency after mask instructing signal DQM is set to the active state of H level, is masked and is not output. Typically, the DQM latency is set to two.

Figure 5:
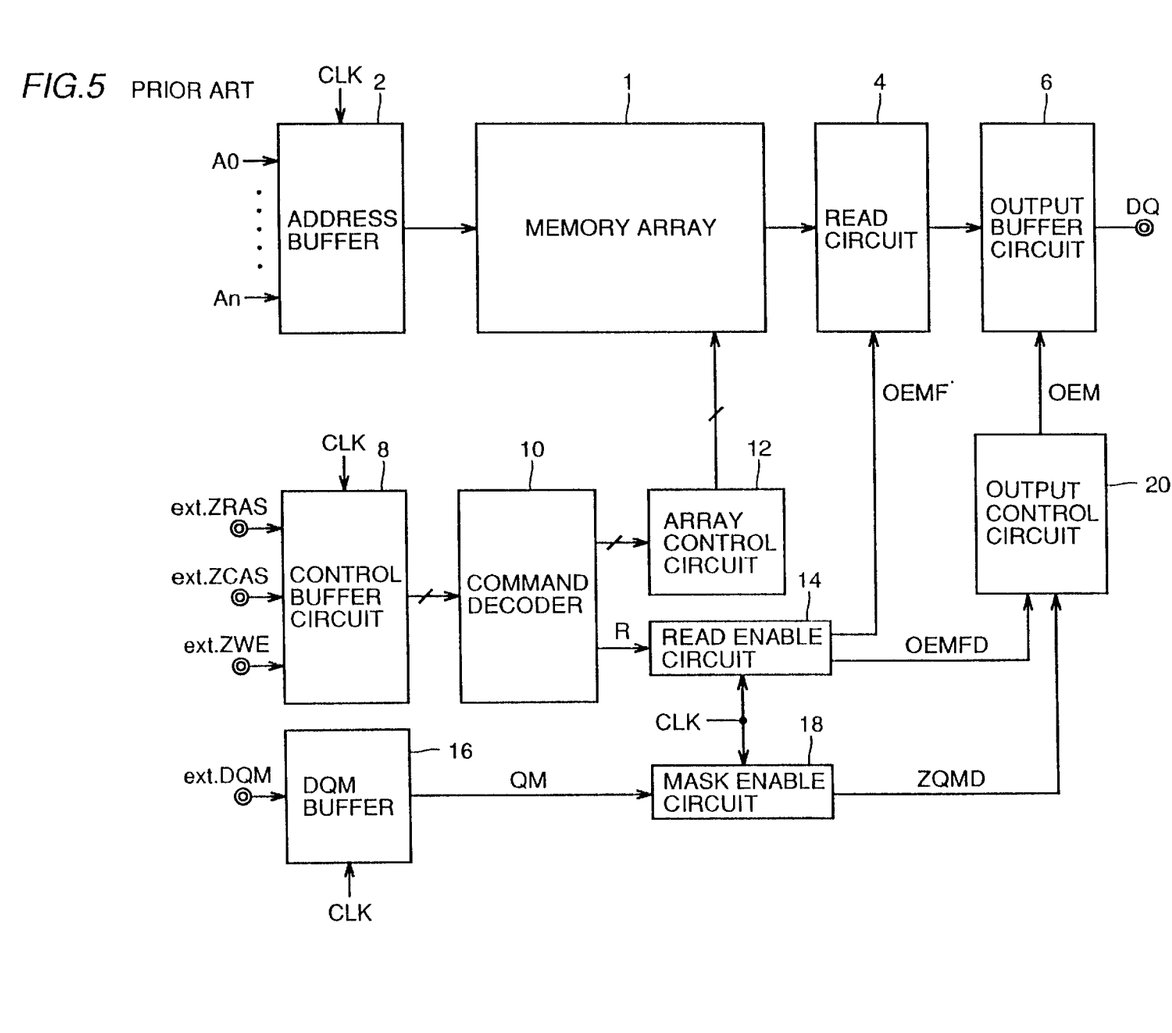
FIG. 5 schematically shows the entire configuration of a conventional synchronous dynamic random access memory.

FIG. 5 schematically shows the entire configuration of a conventional SDRAM. In FIG. 5, the SDRAM includes a memory cell array 1 having a plurality of memory cells arranged in a matrix of rows and columns, an address buffer 2 incorporating address signal bits A0–An externally applied in synchronization with a clock signal CLK and producing an internal address signal, a read circuit 4 activated when reading data for reading data of a memory cell designated by the address signal in memory array 1, and output buffer circuit 6 sequentially outputting the data read from read circuit 4 to a data input/output terminal DQ. In FIG. 5, a circuit portion which selects a row and a column in memory array 1 is not shown in order to simplify the figure.

The SDRAM further includes: a control buffer circuit 8 incorporating externally applied control signals, that is, an external row address strobe signal extZRAS, an external column address strobe signal extZCAS and an external write enable signal extZWE and producing internal control signals; a command decoder 10 identifying states of the internal control signals applied from control buffer circuit 8 to output a triggering signal activating a designated operation mode; an array control circuit 12 outputting a control signal for performing a corresponding designated internal operation in memory array 1 according to an internal operation triggering signal (a row or column selecting operation activating signal) applied from column decoder 10 for application to memory array 1; a read enable circuit 14 producing data read enable signals OEMF and OEMFD in response to activation of a read operation triggering signal R applied from command decoder 10; a DQM buffer 16 incorporating an externally applied data mask instructing signal extDQM synchronously with clock signal CLK and producing an internal mask instructing signal QM; a mask enable circuit 18 delaying internal mask instructing signal QM applied from DQM buffer 16 for a predetermined period and producing a mask enable signal ZQMD; and an output control circuit 20 outputting an output enable signal OEM enabling (i.e., activating) data output operation of output buffer circuit 6 according to data read enable signal OEMFD from read enable circuit 14 and mask enable signal ZQMD from mask enable circuit 18.

Read enable circuit 14 outputs data read enable signal OEMF which is activated for a predetermined period (a clock cycle period represented by burst length) in response to activation of read operation triggering signal R. Furthermore, read enable circuit 14 delays data read enable signal OEMF a predetermined period (a period shorter than the ZCAS latency by one clock cycle) to output read enable signal OEMFD. Mask enable circuit 18 delays mask instructing signal QM by one clock cycle to produce mask enable signal ZQMD.

Figure 6:
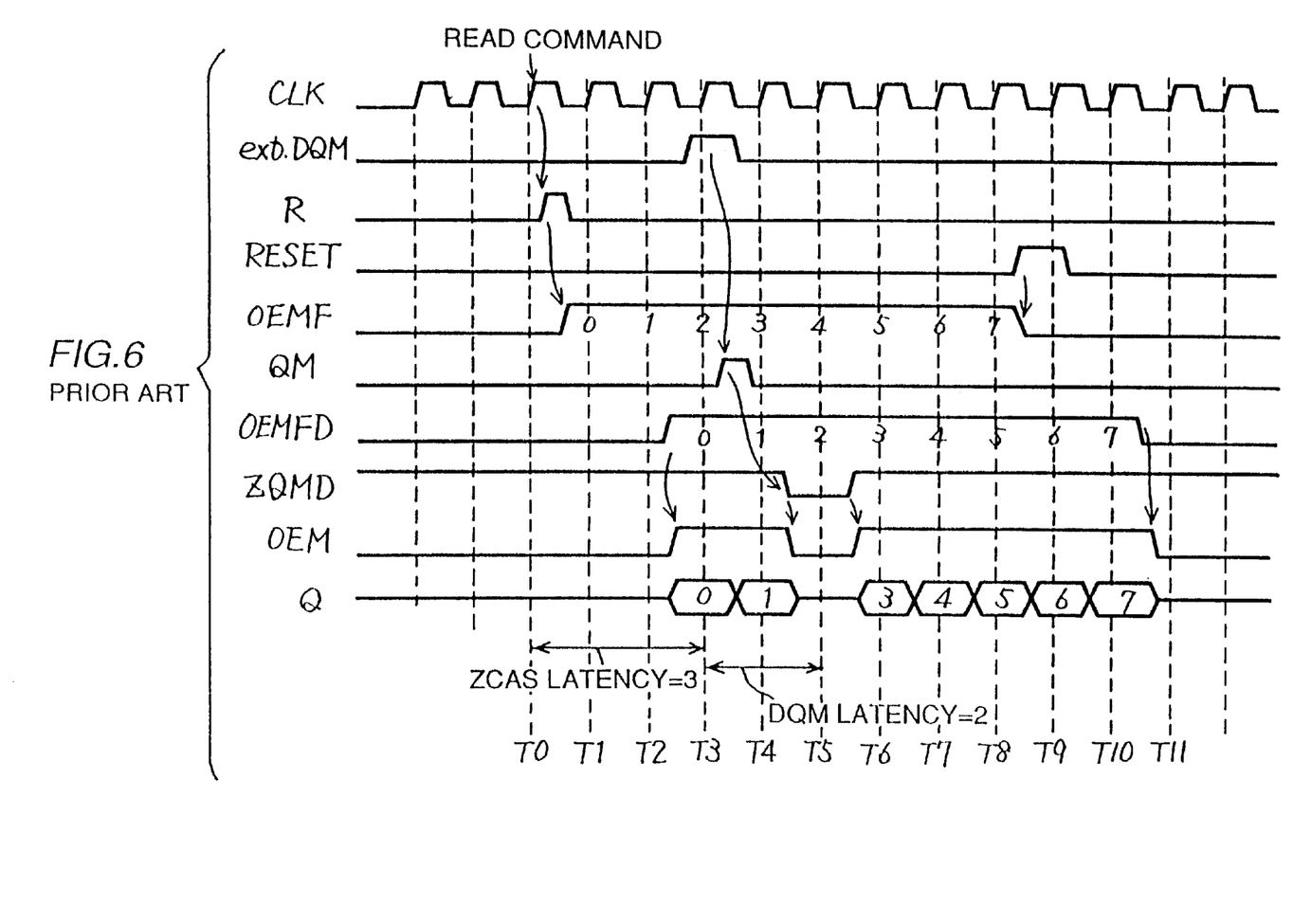
FIG. 6 is a timing chart illustrating operation of the synchronous dynamic random access memory shown in FIG. 5.

Output control circuit 20 activates output enable signal OEM when data read enable signal OEMFD is in an active state and mask enable signal ZQMD is in an inactive state. When mask enable signal ZQMD is activated and instructs masking of output data, output control circuit 20 inactivates output enable signal OEM. Now, data read operation of the SDRAM shown in FIG. 5 will be described with reference to the timing chart shown in FIG. 6. FIG. 6 shows a data read operation when the burst length (the number of data successively read but by one read command) is eight, the ZCAS latency is three and the DQM latency is two.

At a certain time prior to time T0, an active command which instructs starting of memory cell selecting operation is applied, and at time T0, a memory cell is in the selected state in memory array 1.

At time T0, a read command which instructs reading data is applied (external control signals extZRAS, extZCAS and extZWE are set to predetermined states at a rising of clock signal CLK) and, according to an internal control signal applied from control buffer circuit 8, command decoder 10 sets read operation triggering signal R to an active state of H level for a predetermined period. In response to read operation triggering signal R, read enable circuit 14 activates data read enable signal OEMF. The data read enable signal OEMF is kept activated for eight clock cycles (the burst length) following that clock cycle at which the read command is applied. Furthermore, read enable circuit 14 delays data read enable signal OEMF two clock cycles to activate read enable signal OEMFD. Thus, data read enable signal OEMFD is kept activated for eight clock cycles at an elapse of two clock cycles according to the read command applied at time T0 (i.e., from the cycle starting at time T2). In response to the activation of data read enable signal OEMF, read circuit 4 is activated and data of the memory cells selected in memory array 1 is read out. Furthermore, the read command designates column selecting operation and also selects memory cells from the memory cells which in turn have been selected in memory array 1 according to the active command.

In a clock cycle starting at time T2, data read enable signal OEMFD is activated. At that time, mask enable signal ZQMD is still in an inactive state of H level and output control circuit 20 activates data output enable signal OEM. Thus, output buffer circuit 6 is enabled and outputs data applied from read circuit 4 synchronously with the clock signal.

At the rising edge of clock signal CLK at time T3, external mask instructing signal extDQM is set to an active state of H level. In response to the activated mask instructing signal extDQM, mask instructing signal QM which is set to H level for a predetermined period is output from DQM buffer 16. The mask instructing signal QM is delayed by mask enable circuit 18 by two clock cycles. Thus, at time T4, mask enable signal ZQMD is still at H level of an inactive state and, in this cycle also, output enable signal OEM is in an active state and output buffer circuit 6 outputs data.

At time T5, mask enable signal ZQMD from mask enable circuit 18 is set to an active state of L level and accordingly output control circuit 20 inactivates output enable signal OEM. Accordingly, output buffer circuit 6 is inactivated and data output operation is stopped. Thus, data is not output in a cycle starting at time T5.

Since external mask instructing signal extDQM is activated for only one clock cycle period, mask enable signal ZQMD is again inactivated in a clock cycle starting at time T6 and accordingly data output enable signal OEM is activated. Thus, output buffer circuit 6 outputs data applied from read circuit 4 to data output terminal DQ.

In the clock cycle starting at time T8, read enable signal OEMF is set to L level of an inactive state (data read enable signal OEMF is reset according to a reset signal RESET which is output from a burst length counter described later) and read circuit 4 is thus inactivated. There is a delay in data transfer from read circuit 4 to output buffer circuit 6. Since data read enable signal OEMFD is in an active state, output enable signal OEM from output control circuit 20 is maintained at an active state and output buffer circuit 6 sequentially outputs data applied from read circuit 4 in synchronization with clock signal CLK. In a clock cycle starting at time T10, read enable signal OEMFD is inactivated, output enable signal OEM is accordingly inactivated, and output buffer circuit 6 is inactivated, and is set to an output high impedance state.

As described above, data can be sequentially output synchronously with clock signal CLK and data can be read out at high speed.

Furthermore, by employing mask instructing signal extDQM, output of unnecessary data can be inhibited.

The number of clock cycles between time T0 at which a read command is supplied and time T3 at which valid data is first output at data input/output terminal DQ is referred to as ZCAS latency, and an interval from time T3 at which external mask instruction signal extDQM is activated to time T5 at which output data is masked is referred to as DQM latency.

Figure 7:
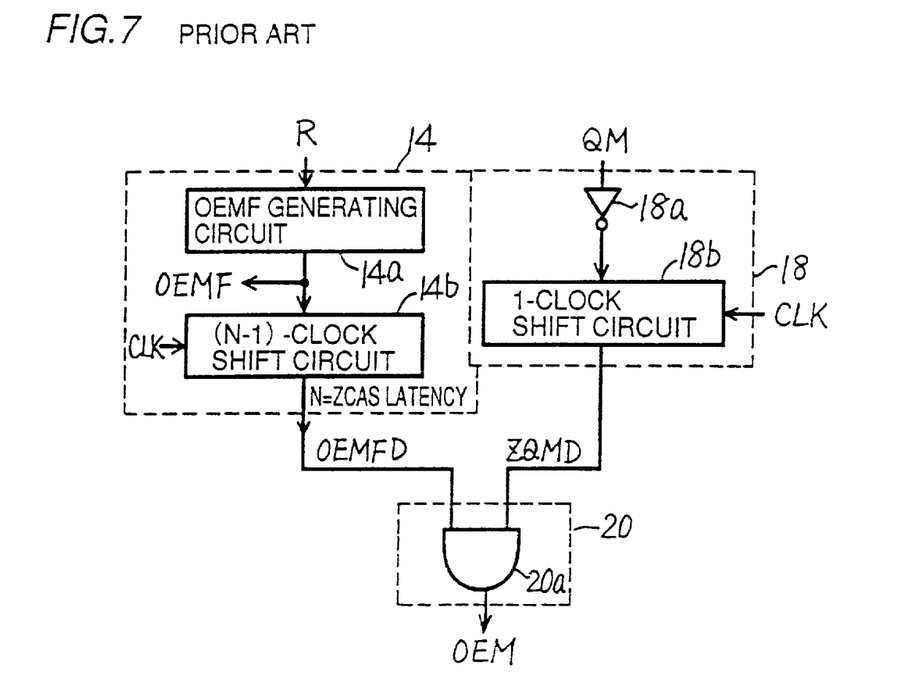
FIG. 7 schematically shows a configuration of a data output controlling portion of a conventional synchronous dynamic random access memory.

FIG. 7 schematically shows configurations of read enable circuit 14, mask enable circuit 18 and output control circuit 20 shown in FIG. 5. In FIG. 7, read enable circuit 14 includes an OEMF generating circuit 14a responsive to read operation triggering signal R for generating read enable signal OEMF activated for a predetermined period and an (N−1)-clock shift circuit 14b which delays read enable signal OEMF applied from OEMF generating circuit 14a by (N−1) clock cycles, wherein N represents the ZCAS latency.

Mask enable circuit 18 includes an inverter 18a which receives mask instructing signal QM and a one-clock shift circuit 18b which delays an output signal of inverter 18a by one clock cycle.

Output control circuit 20 includes two-input AND circuit 20a which receives a delayed read enable signal OEMFD from (N−1)-clock shift circuit 14b and mask enable signal ZQMD from one-clock shift circuit 18b and outputs output enable signal OEM. (N−1)-clock shift circuit 14b and one-clock shift circuit 18b delay input signals as required by shifting the signals applied to their input portions in synchronism with clock signal CLK.

As shown in FIG. 7, read enable circuit 14 and mask enable circuit 18 are individually provided with shift circuits 14b and 18b, respectively. Therefore, layout area of data output operation controlling portion is undesirably increased.

Figure 8:
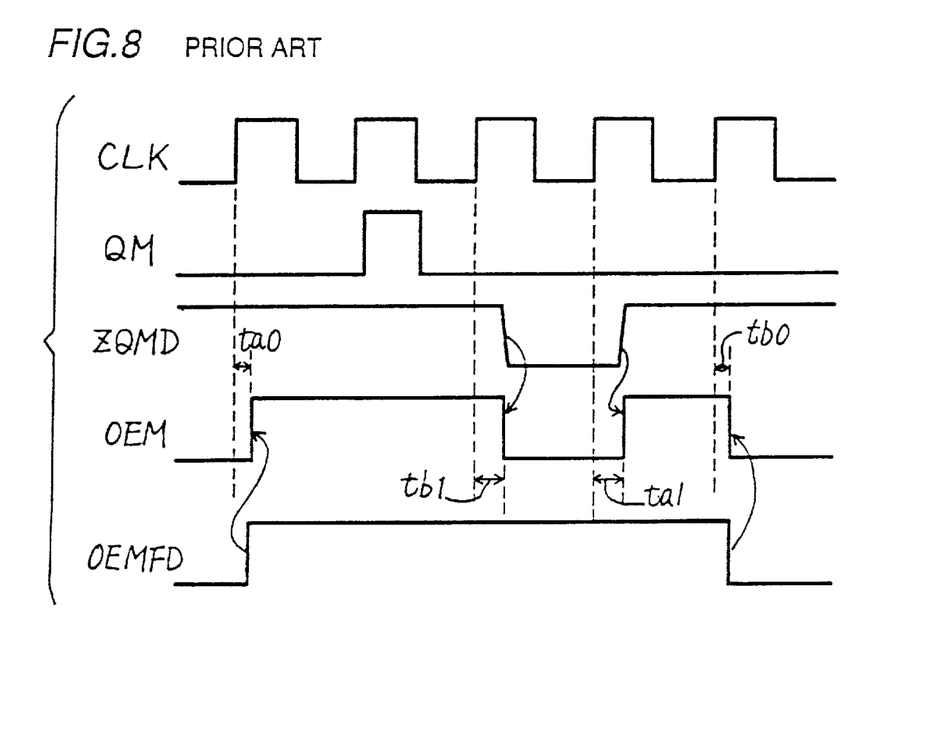
FIG. 8 illustrates disadvantage of the configuration shown in FIG. 7.

FIG. 8 shows timing relationship between data output enable signal OEM and clock signal CLK. When output enable signal OEM rises in response to activation of read enable signal OEMFD, the rising of output enable signal OEM is determined by responsibility of (N−1)-clock shift circuit 14b included in read enable circuit 14 to clock signal CLK, and output enable signal OEM is set to an active state of H level after an elapse of time ta0 since a rising of clock signal CLK. Furthermore, when output enable signal OEM is inactivated in response to inactivation of read enable signal OEMFD, output enable signal OEM is set to an inactive state of L level after an elapse of time tb0 since a rising of clock signal CLK, similarly according to operation characteristic of (N−1)-clock shift circuit 14b of read enable circuit 14.

On the other hand, when output enable signal OEM is changed according to mask instructing signal QM, output enable signal OEM is activated/inactivated via mask enable circuit 18. That is, when mask enable signal ZQMD is set to L level, output enable signal OEM is set to L level of an inactive state. When mask enable signal ZQMD is set to an inactive state of H level, output enable signal OEM returns to an active state of H level. When masking, according to operation characteristic of one-clock shift circuit 18b, output enable signal OEM is inactivated after an elapse of time tb1 since a rising of clock signal CLK. Furthermore, during a mask, output enable signal OEM is set to an active state of H level after an elapse of time ta1 since a rising of clock signal CLK to H level.

In FIG. 8, responsibility of output enable signal OEM to mask enable signal ZQMD is shown being slower than that of output enable signal OEM to read enable signal OEMFD, which is merely illustrative. Thus, if responsibilities of clock shift circuits 14b and 18b to the clock signal are different from each other, timing of activation/inactivation of output enable signal OEM is different with respect to a changing point of clock signal CLK, such a change of timing of defining of output enable signal OEM should be taken into consideration in outputting data, which means that data cannot be output at high speed. Even if clock shift circuits 14b and 18b have the same responsibility with respect to clock signal CLK, if the distance between output control circuit 30 and read enable circuit 14 is different from that between output control circuit 20 and mask enable circuit 18, the interconnection line lengths are different, propagation delays of signals OEMFD and ZQMD are accordingly different from each other and timing of change of output enable signal OEM is similarly different with respect to a changing point of clock signal CLK.

Thus, since enabling (activation)/disabling (inactivation) of the output buffer circuit is different with respect to clock signal CLK, valid data may be partially masked or data to be masked may not be entirely masked so that accurate data output may not be achieved.

SUMMARY OF THE INVENTION

An object of the present invention is to provide a synchronous dynamic random access memory capable of activating/inactivating an output enable signal at the same timing with respect to a clock signal when a mask enable signal and a read enable signal are activated.

A synchronous dynamic random access memory according to the present invention includes: output buffer circuitry coupled with a data output terminal for outputting data to the data output terminal when activated; data read enable signal generating circuitry responsive to an externally applied data read instructing signal for generating a data read enable signal instructing data read; mask signal generating circuitry responsive to activation of an externally applied read data mask instructing signal for outputting an output mask instructing signal for activating the output buffer circuitry; and output control circuitry for receiving the data read enable signal and the output mask instructing signal and activating the output buffer circuitry synchronously with the clock signal when both the data read enable signal and the output mask instructing signal instruct data output.

By providing a common output controlling circuit portion operating in response to the clock signal with respect to the mask instructing signal and the data read enable signal and by controlling enabling/disabling of the output buffer circuitry by the common output controlling circuit portion, timing of enabling/disabling of the output enable signal according to the mask enable signal and that of enabling/disabling of the output enable signal according to the data read enable signal are made the same with each other with respect to the clock signal and margin for timing of enabling/disabling of the output buffer circuitry need not be taken into consideration, high speed and stable data output can be achieved and, when masking, it is ensured that data can be masked as required.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
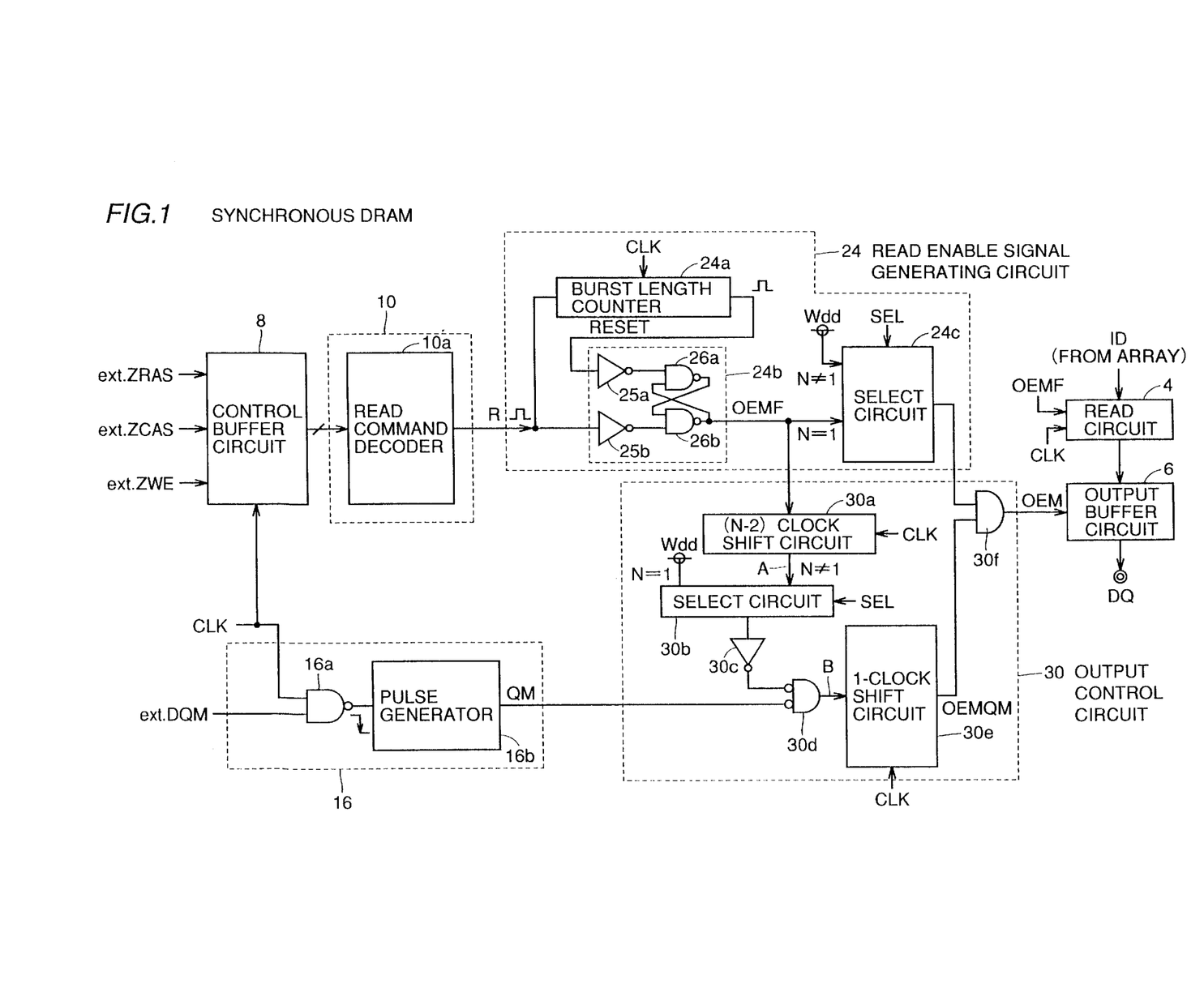
FIG. 1 shows a configuration of the main portion of a synchronous dynamic random access memory according to an embodiment of the present invention.

FIG. 1 shows a configuration of a data output operation controlling portion of a SDRAM according to an embodiment of the present invention. In FIG. 1, the SDRAM includes a control buffer circuit 8 incorporating externally applied control signals extZRAS, extCAS and extZWE synchronously with clock signal CLK to generate internal control signals, and a command decoder 10 decoding internal control signals applied from control buffer circuit 8 to output a signal indicating the decoded result. In FIG. 1, only a read command decoder 10a decoding a read command instructing data read operation is shown in command decoder 10. When internal control signals applied from control buffer circuit 8 synchronously with clock signal CLK are in a combination of predetermined states, read command decoder 10a activates a data read operation triggering signal R for a predetermined period. The read command is applied by setting external control signals extZRAS and extZWE to H level and external control signal extCAS to L level at a rising of clock signal CLK.

The SDRAM also includes a DQM buffer circuit 16 incorporating an externally applied mask instructing signal extDQM synchronously with clock signal CLK to generate an internal data mask instructing signal QM. DQM buffer circuit 16 includes an NAND circuit 16a receiving clock signal CLK and an external mask instructing signal extDQM and a pulse generator 16b generating a one-shot pulse signal in response to falling of an output signal of NAND circuit 16a to activate internal mask instructing signal QM. In control buffer circuit 8, a configuration similar to that of DQM buffer circuit 16 is provided corresponding to each external control signal.

The SDRAM also includes a read enable signal generating circuit 24 generating a read enable signal OEMF activated for a predetermined time period in response to read operation triggering signal R from read command decoder 10a, and an output control circuit 30 receiving internal mask instructing signal QM from DQM buffer circuit 16 and read enable signal OEMF to generate a data output enable signal OEM for application to an output buffer circuit 6. When activated, output buffer circuit 6 outputs to a data output terminal DQ data applied from a read circuit 4 which is activated in response to read enable signal OEMF and successively outputs data ID internally read out in synchronization with clock signal CLK.

Read enable signal generating circuit 24 includes a burst length counter 26 started in response to read operation triggering signal R to count clock cycle periods of a burst length, a flipflop 24b set in response to activation of read operation triggering signal R to activate read enable signal OEMF and reset in response to a count up signal from burst length counter 24a to inactivate read enable signal OEMF, and a select circuit 24c selecting one of a power supply potential Vdd and read enable signal OEMF in response to a select signal SEL. Burst length counter 24a is constructed by, for example, a shift circuit and outputs the count up signal by shifting read operation triggering signal R for clock cycle periods of the burst length. The burst length counted by burst length counter 24a is designated by burst length data stored in a register which is not shown in the figure.

Flipflop 24b includes an inverter 25b receiving read operation triggering signal R, an inverter 25a receiving a count up signal from burst length counter 24a, an NAND circuit 26b receiving at its one input an output signal of inverter 25a, and an NAND circuit 26a receiving at its one input an output signal of inverter 25a. Read enable signal OEMF is output from NAND circuit 26b. An output signal of NAND circuit 26a is applied to the other input of NAND circuit 26b. Similarly, read enable signal OEMF output from NAND circuit 26b is applied to the other input of NAND circuit 26a.

The level of select signal SEL applied to select circuit 24c is set according to ZCAS latency data stored in a register which is not shown in the figure. Select circuit 24c selects read enable signal OEMF when select signal SEL indicates that the ZCAS latency is one, and otherwise selects power supply potential Vdd. Power supply potential Vdd is used as a normally activated signal.

Output control circuit 30 includes an (N−2)-clock shift circuit 30a delaying read enable signal OEMF by (N−2) clock cycle periods, a select circuit 30b selecting one of an output signal from (N−2)-clock shift circuit 30a and power supply potential Vdd according to select signal SEL, an inverter 30c inverting an output signal of select circuit 30b, an NOR circuit 30d receiving an output signal of inverter 30c and internal mask instructing signal QM, a one-clock shift circuit 30e delaying an output signal of NOR circuit 30d one clock cycle period, and an AND circuit 30f obtaining a logical product of an output signal OEMQM of one-clock shift circuit 30e and an output signal of select circuit 24c. Data output enable signal OEM is output from AND circuit 30f.

(N−2)-clock shift circuit 30a delays read enable signal OEMF by (N−2) clock cycle period, that is, a period shorter than the ZCAS latency by two clock cycles and outputs the delayed read enable signal OEMF. Select circuit 30b selects power supply potential Vdd when the ZCAS latency is one, and otherwise selects the delayed read enable signal from (N−2)-clock shift circuit 30a. Operation of the data output controlling portion shown in FIG. 1 will now be described with reference to timing charts shown in FIGS. 2 and 3.

Figure 2:
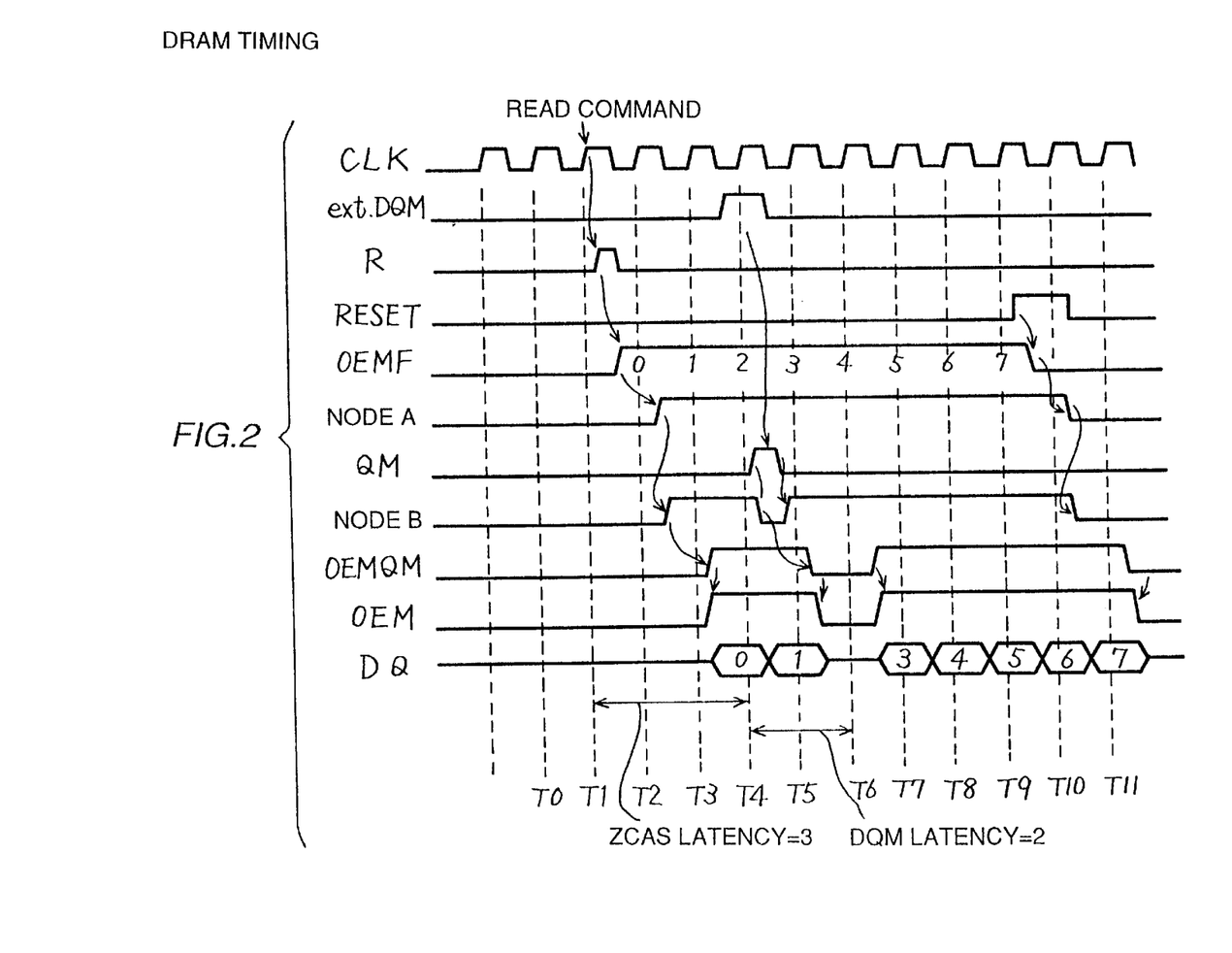
FIG. 2 is a timing chart illustrating operation of the circuit shown in FIG. 1 where the ZCAS latency is three.

Referring first to FIG. 2, operation when the ZCAS latency is three will be described. When the ZCAS latency is three, select circuit 24c selects power supply potential Vdd. Accordingly, read enable signal generating circuit 24 applies to AND circuit 30f a signal which is normally at H level. Furthermore, select circuit 30b is set to such a state that it selects an output signal of (N−2)-clock shift circuit 30a, that is a delayed read enable signal OEMF. Thus, the state of data output enable signal OEM from AND circuit 30f is determined according to an output signal of one-clock shift circuit 30e, that is, delayed read enable signal OEMF and internal mask instructing signal QM.

First, at time T0, for example, prior to time T1, an active command, which is not shown in the figure, is applied, the SDRAM is activated, and memory cell selecting operation is internally performed.

At time T1, a read command is applied and read operation triggering signal R from read command decoder 10a is set to an active state of H level for a predetermined period. According to the activation of read operation triggering signal R, flipflop 24b is set and read enable signal OEMF is set to an active state. Furthermore, burst length counter 24a is started in response to the activation of read operation triggering signal R and starts count operation.

(N−2)-clock shift circuit 30a delays an applied read enable signal OEMF by one clock cycle (this delay is implemented by shift operation) and at time T2, a potential of an output node A of circuit 30a rises to H level. The ZCAS latency is three and (N−2)-clock shift circuit 30a performs shift operation of one clock cycle to provide a delay of one clock cycle. Select circuit 30b selects the output signal of (N−2)-clock shift circuit 30a. Furthermore, external mask instructing signal extDQM is at L level and internal mask instructing signal QM is at L level. Accordingly, in response to the rising of the potential of node A, a potential of an output node B of NOR circuit 30d rises to H level.

Since one-clock shift circuit 30e delays an output signal of NOR circuit 30d by one clock cycle and outputs the delayed output signal, the output signal OEMQM is set to H level in a clock cycle starting at time T3. In response to the rising of signal OEMQM to H level, data output enable signal OEM output from AND circuit 30f is set to an active state of H level. Thus, output buffer circuit 6 is activated and outputs data applied from read circuit 4.

In a clock cycle starting at time T4, external mask instructing signal extDQM is set to H level. In synchronization with a rising of clock signal CLK, an output signal of NAND circuit 16a falls to L level and internal mask instructing signal QM output from pulse generator 16b is set to and kept at an active state of H level for a predetermined period. In response to the activation of internal mask instructing signal QM, a potential of output node B of NOR circuit 30d falls to L level and the potential level of node B is taken into one-clock shift circuit 30e.

In a clock cycle starting at time T5, one-clock shift circuit 30e shifts the taken L level signal and sets its output signal OEMQM to L level. The signal OEMQM is set to L level for one clock cycle period by shift circuit 30e performing shift operation synchronously with the clock signal. In response to the falling of the signal OEMQM to L level, data output enable signal OEM output from AND circuit 30f is set to an inactive state of L level and output buffer circuit 6 is disabled (i.e., set to an output high impedance state). Thus, data to be output at time T6 following data DQ(1) output at time T5 is not output.

External mask instructing signal extDQM is set to H level only at time T4 and the potential of output node B of NOR circuit 30d returns to H level in a clock cycle starting at time T5. Thus, in a clock cycle starting at time T6, an output signal of one-clock shift circuit 30e returns to H level and data output enable signal OEM output from AND circuit 30f is accordingly set to an active state of H level. Thus, in a clock cycle starting at time T7, output buffer circuit 6 is again enabled and successively output data applied from read circuit 4. At times T7, T8 and T9, data DQ(3), DQ(4) and DQ(5) are output, respectively.

Since the burst length is set to eight, in a clock cycle starting at time T9, a count up signal RESET from burst length counter 24a is set to H level, flipflop 24b is reset, read enable signal OEMF is set to an inactive state of L level and read circuit 4 is inactivated. After one clock cycle's delay, in a clock cycle staring at time T10, the potential of output node A of (N−2)-clock shift circuit 30a falls to L level. In response to the falling of the potential of node A, the potential of output node B of NOR circuit 30d falls to L level.

The falling of the potential of node B is delayed for one clock cycle and transmitted by one-clock shift circuit 30e and in a clock cycle starting at time T11, signal OEMQM is set to an inactive state of L level. Responsively, data output enable signal OEM output from AND circuit 30f is set to an inactive state of L level and output buffer circuit 6 is set to a disabled state (an output high impedance state). Thus, a series of data output operations ends.

The number of clock shifts (delay) provided by (N–2)-clock shift circuit 30a and one-clock shift circuit 30e is (N–1) clock cycles and combination of circuits 30a and 30b is equivalent to a clock shift circuit outputting signal OEMFD in a conventional configuration. Furthermore, one-clock shift circuit 30e delays mask instructing signal QM by one clock cycle and it is equivalent to a clock shift circuit used for implementing a conventional DQM latency.

No matter whether enabling/disabling of data output enable signal OEM is controlled by signal OEMF or by signal QM, timing of enabling/disabling of data output enable signal OEM with respect to clock signal CLK is made the same since enabling/disabling of data output enable signal OEM is determined by one-clock shift circuit 30e operating synchronously with the same clock signal, and it is not necessary to take into consideration timing deviation of data output enable signal OEM between when masking and when outputting of data, and fast and accurate data output can be achieved.

Figure 3:
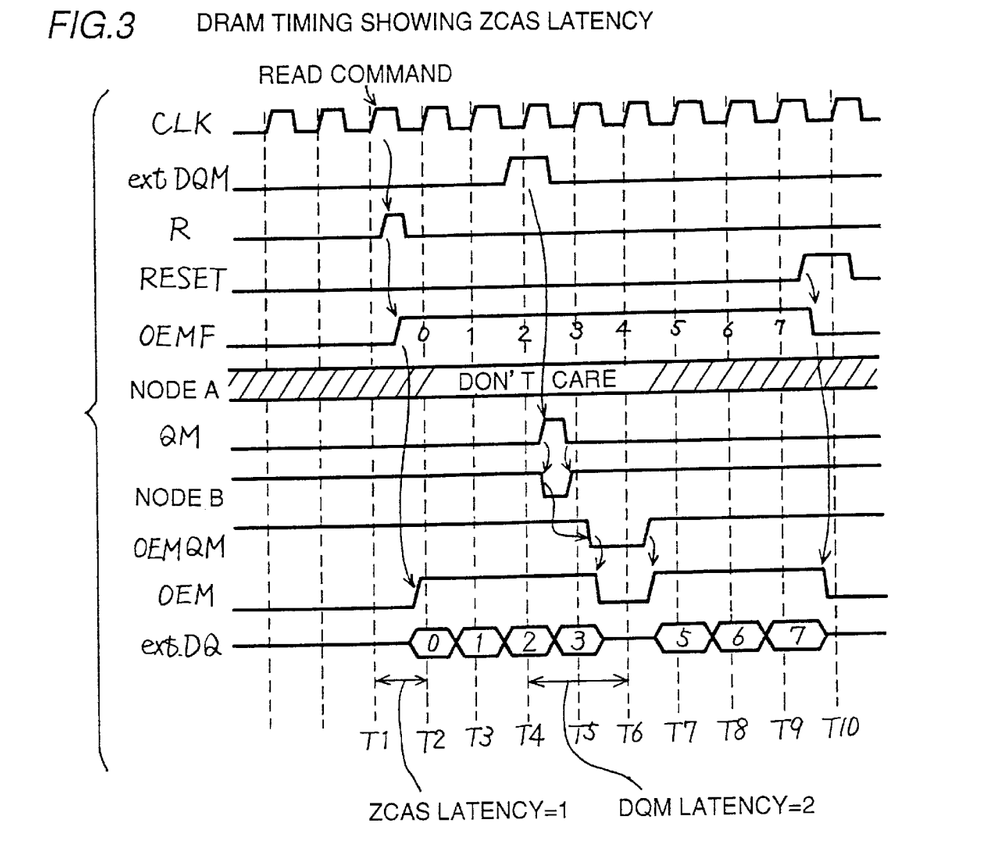
FIG. 3 is a timing chart illustrating operation of the circuits shown in FIG. 1 where the ZCAS latency is one.

FIG. 3 is a timing chart illustrating the data read operation when the ZCAS latency is one. When the ZCAS latency is one, select circuit 24c is so set as to select read enable signal OEMF and select circuit 30b is so set as to select power supply potential Vdd. In this condition, an output signal of select circuit 30b is normally at H level and NOR circuit 30b is normally enabled to act as an inverter. In this example, the burst length is eight.

Prior to time T1, an active command is applied and a memory cell is internally selected.

At time T1, when a read command is applied, read command decoder 10a sets read operation triggering signal R to an active state of H level according to internal control signals from control buffer circuit 8. In response to the activation of read operation triggering signal R, flipflop 24b is set and read enable signal OEMF is set to an active state of H level. The read enable signal OEMF is selected by select circuit 24c and applied to AND circuit 30f. Also in response to the activation of read operation triggering signal R, burst length counter 24a is started to perform count operation.

External mask instructing signal extDQM is still at the L level and internal mask instructing signal QM is at the L level. Since NOR circuit 30d acts as an inverter and signal OEMQM output from one-clock shift circuit 30e is at H level (the potential of node B is at H level), data output enable signal OEM output from AND circuit 30f is set to an active state of H level in response to the rising of read enable signal OEMF and output buffer circuit is activated. Data applied from read circuit 4 activated in response to read enable signal OEMF is transmitted to data output terminal DQ via output buffer circuit 6. Thus, data DQ(0) is output at time T2 after an elapse of one clock cycle from time T1 at which the read command is applied.

At times T2 and T3, data DQ(0) and DQ(1) are successively output in synchronization with clock signal CLK. At time T4, external mask instructing signal extDQM is set to H level and accordingly, internal mask instructing signal QM from DQM buffer circuit 16 is set to an active state of H level. Responsively, the potential of output node B of NOR circuit 30d is set to L level. The falling of the potential of node B is delayed by one-clock shift circuit 30e by one clock cycle. Thus, after data DQ(2) and DQ(3) are output at times T4 and T5, output signal OEMQM of one-clock shift circuit 30e is set to L level by one clock cycle period in a clock cycle starting at time T5. In response to the falling of signal OEMQM to L level, data output enable signal OEM from AND circuit 30f is set to L level and output buffer circuit 6 is disabled. Thus, data DQ(4) to be output at time T6 will not be output.

In a clock cycle starting at time T6, the H level of the potential of node B is transmitted via one-clock shift circuit 30e, signal OENQM is set to an active state of H level and accordingly, data output enable signal OEM output from AND circuit 30f is set to an active state of H level. Thus, output buffer circuit 6 is again enabled and data DQ(5), DQ(6) and the DQ(7) applied from read circuit 4 are output at times T7, T8 and T9, respectively.

The burst length is eight and in a clock cycle starting at time T9, count up signal RESET from burst length counter 24a is set to an active state of H level, flipflop 24b is reset and read enable signal OEMF is set to an inactive state of L level. Read enable signal OEMF is applied to AND circuit 30f via select circuit 20c and accordingly, in response to the inactivation of read enable signal OEMF, data output enable signal OEM is set to an inactive state of L level and output buffer circuit 6 is disabled (inactivated).

When the ZCAS latency is one, only one-clock shift circuit 30e for implementing the DQM latency is employed. (N–2)-clock shift circuit 30a is not employed. Therefore, when the ZCAS latency is one, it is not necessary to take the timing conditions into consideration, either as is the case where clock shift circuits are different since only a single clock shift circuit is employed for both the cases of inputting a read command and applying a mask instructing signal, and enabling/disabling of the data output enable signal can be determined at the same timing.

Furthermore, the ZCAS latency is generally determined appropriately according to application of the SDRAM (for example, according to the frequency of the system clock or the like). A clock shift circuit for implementing the ZCAS latency is always provided. By making common a clock shift circuit determining the ZCAS latency and a clock shift circuit determining the DQM latency, the number of components of the clock shift circuit for latency implementation is reduced and accordingly circuit occupying area is reduced.

Figure 4:
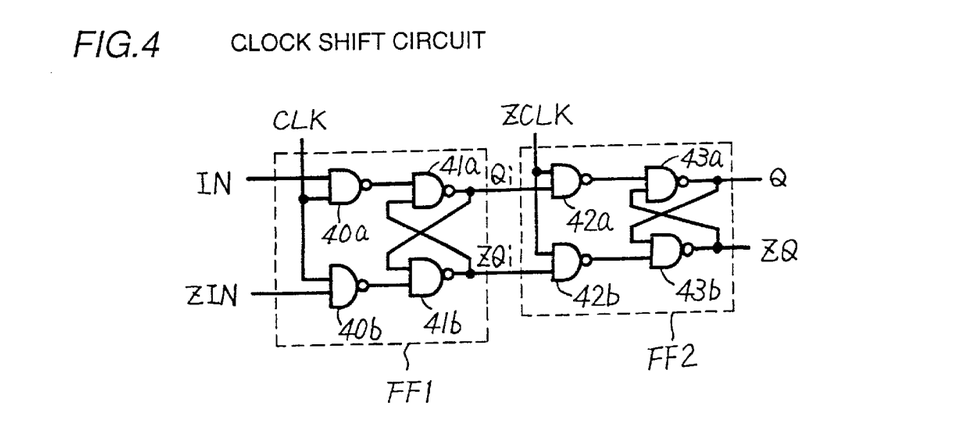
FIG. 4 shows an example of a configuration of one-stage of the clock shift circuit shown in FIG. 1.

FIG. 4 shows a configuration of one stage of a clock shift circuit. In FIG. 4, one stage of a clock shift circuit (30a or 30e) includes cascaded flipflops FF1 and FF2. Flipflop FF1 includes an NAND circuit 40a receiving an input signal IN and a clock signal CLK, an NAND circuit 40b receiving clock signal CLK and an inverted input signal ZIN, an NAND circuit 41a receiving at its one input an output signal of NAND circuit 40a and an NAND circuit 41b receiving at its one input an output signal of NAND circuit 40b. An output of NAND circuit 41a and the other input of NAND circuit 41b are cross-coupled. NAND circuit 41a outputs an output signal Qi and NAND circuit 41b outputs the complementary output signal ZQi.

Flipflop FF2 includes an NAND circuit 40a receiving an inverted clock signal ZCLK and signal Qi, an NAND circuit 42b receiving inverted clock signal ZCLK and signal ZQi, an NAND circuit 43a receiving at its one input an output signal of NAND circuit 42a, and an NAND circuit 43b receiving at its one input an output of NAND circuit 42b. An output of NAND circuit 43a and the other input of NAND circuit 43b are cross-coupled. NAND circuit 43a outputs an output signal Q and NAND circuit 43b outputs a signal ZQ. Clock signals CLK and ZCLK are clock signals complementary to each other.

When clock signal CLK is at H level, clock signal ZCLK is at L level. In this state, in flipflop FF1, NAND circuits 40a and 40b act as inverters and NAND circuits 41a and 41b latch input signals IN and ZIN. In flipflop FF2, clock signal ZCLK is at L level, output signals of NAND circuits 42a and 42b are both at H level and states of output signals Q and ZQ are unchanged.

When clock signal CLK is set to L level and clock signal ZCLK is set to H level, in flipflop FF1, output signals of NAND circuits 40a and 40b are set to H level and its output signals Qi and ZQi are unchanged. In flipflop FF2, NAND circuits 42a and 42b act as inverters and NAND circuits 43a and 43b latch signals Qi and ZQi. Thus, output signals Q and ZQ are set to the states corresponding to the applied signals Qi and ZQi.

In other words, the one stage (flipflops FF1 and FF2) of the clock shift circuit takes and latches input signal IN in response to a rising of clock signal CLK and outputs output signals Q and ZQ synchronously with a falling of clock signal CLK. Thus, output signals Q and ZQ changes with a delay of a half clock cycle period relative to input signals IN and ZIN and their states are maintained for one clock cycle period. As the subsequent clock shift stage takes the signals Q and ZQ in response to a rising of clock signal CLK to H level, a one-clock shift circuit is implemented. By cascading by the required number the clock shift circuit of one stage constituted by flipflops FF1 and FF2 shown in FIG. 4 and by selecting output signals Q, ZQ of an appropriate stage, a desired clock shift circuit can be implemented.

In the case where the ZCAS latency is no less than two, when a read command is applied, the read command need be shifted by one clock cycle period shorter than the ZCAS latency. On the other hand, in the case of output control by external mask instructing signal extDQM, the mask instructing signal need be delayed by shifting it by one clock cycle period. Thus, when the ZCAS latency is no less than two, either the read command or the mask instructing signal (a mask command) need be shifted by one clock cycle period and by sharing the shifting portion, the layout area of the output controlling portion can be reduced. Furthermore, since data output enable signal OEM is generated according to a signal from a common circuit portion in cases where a read command is applied and where a mask command is applied, the time required from a rising of clock signal CLK to enabling/disabling of output buffer circuit 6 is made the same whichever command is applied, it is not necessary to take timing margin into consideration, and fast and stable data output can be achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device operating synchronously with an external, periodically and repeatedly applied clock signal, comprising:
   an output buffer circuit coupled with a data output terminal for outputting applied data to said data output terminal when activated;
   read enable signal generating circuitry responsive to an externally applied data read instructing command represented by a combination of logic states of a plurality of external signals for generating a data read enable signal instructing data read, said data read enable signal kept active for a predetermined time interval;
   mask signal generating circuitry responsive to activation of an externally applied read data mask instructing signal for outputting an output mask instructing signal inactivating said output buffer circuit; and
   output controlling circuitry receiving said data read enable signal and said output mask instructing signal, for activating said output buffer circuit synchronously with said clock signal in response to said data read enable signal and said output mask instructing signal both instructing data output.

2. The synchronous semiconductor memory device according to claim 1, wherein said output controlling circuitry comprises:
   a first delay circuit for delaying said data read enable signal by a first predetermined number of cycles of said clock signal;
   a gate circuit coupled to receive an output signal of said first delay circuit and said output mask instructing signal for inactivating the output signal of said first delay circuit when said output mask instructing signal is activated;
   a second delay circuit for delaying an output signal of said gate means by a second predetermined clock cycle period of said clock signal; and
   a circuit responsive to activation of an output signal of said second delay circuit for activating said output buffer circuit.

3. The synchronous semiconductor memory device according to claim 1, wherein said read enable command generating circuitry comprises a circuit responsive to activation of said data read instructing signal for activating said data read enable signal for a cycle period of said clock signal determined as a burst length.

4. The synchronous semiconductor memory device according to claim 2, wherein
   said first delay circuit includes a delay circuit delaying said data read enable signal by two cycle periods shorter than a clock cycle period required from application of said data read instructing command to output of data at said data output terminal via said output buffer circuit, and wherein
   said second delay circuit includes a delay circuit delaying an output signal of said gate circuit by one clock cycle period of said clock signal.

5. The synchronous semiconductor memory device according to claim 1, wherein
   said read enable signal generating circuitry includes,
   a pulse generating circuit incorporating said externally applied data read instructing command in synchronization with the clock signal, for generating a one-shot pulse in response to the data read instructing command instructing a data read operation,
   a counter circuit responsive to said one-shot pulse to start an operation of counting said clock signal for generating a count up signal when the count reaches a predetermined number, and
   a flipflop circuit set in response to said one-shot pulse for activating said data read instructing signal and reset in response to said count up signal for deactivating said data read instructing signal.

6. The synchronous semiconductor memory device according to claim 5, wherein said counter circuit comprises a shifter for shifting said on-shot pulse in synchronization with said clock signal by said predetermined number of cycles of said clock signal.

7. The synchronous semiconductor memory device according to claim 1, wherein said output controlling circuitry comprises a first shift circuit coupled to receive the data read enable signal for shifting the received data read enable signal by a predetermined number of cycles of the clock signal in synchronization with said clock signal, a gate circuit coupled to receive said output mask instructing signal and an output of said first shifter circuit to generate a signal at an active state when the output of said first shifter circuit is active to instruct outputting of data and said output mask instructing signal is inactive to instruct outputting of data, and a second shifter circuit coupled to receive the signal from said gate circuit to shift the received signal by one cycle of said clock signal to generate a signal for activating said output buffer circuit.

8. A synchronous semiconductor memory device inputting and outputting data in synchronization with an externally applied clock signal of a predetermined pulse width, comprising:

command decode circuitry incorporating external signals in synchronization with the clock signal for decoding the external signals to generate a read designation signal in accordance with the result of decoding, a first counter coupled to receive said read designation signal and responsive to said read designation signal being active to start counting the clock signal for generating a reset signal when the count reaches a value equal to a burst length;

a flipflop coupled to receive the read designation signal and the reset signal and set in response to the read designation signal being active to activate a read enable signal at an output thereof and reset in response to the reset signal to deactivate the read enable signal;

a first selector for passing one of the read enable signal and a reference potential of a first level indicating an active state in accordance with a selection control signal;

a pulse generator incorporating an external data output mask instructing signal in synchronization with said clock signal for generating a one-shot pulse in response to the external data output mask instructing signal being active at a leading edge of the clock signal;

a second counter coupled to receive the read enable signal from the flipflop, for shifting the read enable signal in synchronization with the clock signal by N minus 2 cycle(s) of the clock signal for outputting, where N indicates ZCAS latency;

a second selector for passing one of an output signal of the second counter and the reference signal at the first level in accordance with the selection control signal in a complementary fashion to said first selector, a gate circuit coupled to receive said one-shot pulse and an output of said second selector to perform a logical operation on the received signals to generate a read/mask control signal at an active state when the output of the selector is active and the one-shot pulse is inactive, said gate circuit being disabled to make the read/mask control signal inactive responsive to generation of said one-shot pulse;

a third counter coupled to receive the read/mask control signal to shift the read/mask control signal by one cycle of the clock signal for outputting in synchronization with the clock signal, a gate coupled to receive outputs of the first selector and the third counter and enabled responsive to the output of the first selector being active for passing the output of the third counter transparently, and an output buffer circuit activated responsive to an output of said gate being active, for receiving and buffering internal read data applied in synchronization with the clock signal, for outputting to a data output terminal.

9. A semiconductor memory device comprising:

an output buffer circuit for outputting data to a data output terminal when activated;

read enable signal generating circuitry for generating a data read enable signal in synchronization with a clock signal applied externally, periodically and repeatedly thereto, in response to a data read instructing command externally applied for thereto;

masking signal generating circuitry for generating an output mask instruction signal in response to an external applied read data mask instruction signal;

first delay circuitry for delaying said data read enable signal from said read enable signal generation circuitry by a predetermined number of cycle of said clock signal; and second delay circuitry, coupled to said mask signal generation circuitry and said first delay circuitry, generating an active signal for activating said output buffer circuit in response to said delayed data read enable signal from first delay circuitry and said output mask instructing signal from said masking signal generating circuitry, delaying said active signal through a shift operation in synchronization with said clock signal, and outputting said delayed active signal to said output buffer circuit.

10. The semiconductor memory device according to claim 9, wherein said second delay circuit comprises:

a logic gate receiving the output signal of said first circuitry and said output mask instructing signal, for generating said activation when said first delay circuitry and output mask instructing signal both instruct activation of said output buffer; and clock shift circuitry for shifting said activation signal received from said logic gate in synchronization with said clock signal for output.

11. The semiconductor memory device according to claim 9, further comprising a first selector for selecting either one of a reference voltage and said data read enable signal in response to a selection signal;

a second selector coupled between said first delay circuitry and said second delay circuitry for selecting either one of the reference voltage and the output of said first delay circuitry for application to said second delay circuitry in response to said selection signal, the first and second selectors selecting said reference voltage complimentarily to each other in response to said selection signal, and a combination logic circuit receiving an output signal of said first selector and an output signal of said second delay circuitry, for applying said activation signal to said output buffer circuit when said first selector selects and outputs said reference voltage.

12. The semiconductor memory device according to claim 9, wherein said first delay circuitry delays said data read enable signal by (N−2) cycles of said clock signal through a shifting operation synchronous with said clock signal, and said second delay circuitry delays the activation signal by one cycle of said clock signal, where N, an integer greater than two, indicates a clock cycle number required from application of said data read instruction command until outputting of a valid data from said output buffer circuit.

13. The semiconductor memory device according to claim 9, wherein said first selector selects said reference voltage when said selection signal is at a first logic level indicating that a CAS latency is greater than two, said CAS latency indicating a clock cycle number of said clock signal required from application of the data read instructing command until outputting of a valid data from the output buffer circuit.

* * * * *